United States Patent
Shim et al.

(12) 
(10) Patent No.: US 6,437,613 B2
(45) Date of Patent: Aug. 20, 2002

(54) CLOCK GENERATING CIRCUIT FOR COMPENSATION OF DELAY DIFFERENCE USING CLOSED LOOP ANALOG SYNCHRONOUS MIRROR DELAY STRUCTURE

(75) Inventors: Dae-yun Shim, Kwangmyong; Won-chan Kim, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/730,634

(22) Filed: Dec. 6, 2000

(30) Foreign Application Priority Data

Dec. 30, 1999 (KR) .............................................. 99-66015

(51) Int. Cl.⁷ ................................................. H03L 7/00
(52) U.S. Cl. ....................................... 327/141; 327/108
(58) Field of Search ................................ 327/108, 141, 327/145, 148, 149, 150, 153, 157, 158, 159, 161, 162, 166, 291, 298, 299, 175; 375/293, 294, 354, 376; 361/191, 205, 194, 233; 331/1

(56) References Cited

U.S. PATENT DOCUMENTS

| | | | | |
|---|---|---|---|---|
| 5,233,314 A | * | 8/1993 | McDermott et al. | 331/1 A |
| 5,359,727 A | * | 10/1994 | Kurita et al. | 331/10 |
| 5,373,254 A | * | 12/1994 | Nakauchi et al. | 331/1 A |
| 5,926,047 A | * | 7/1999 | Harrison | 327/159 |
| 6,081,143 A | * | 6/2000 | Ho et al. | 327/166 |
| 6,122,190 A | * | 9/2000 | Ooishi | 365/149 |
| 6,141,292 A | * | 10/2000 | Lee et al. | 365/233 |
| 6,147,927 A | * | 11/2000 | Ooishi | 365/191 |
| 6,166,990 A | * | 12/2000 | Ooishi et al. | 365/194 |
| 6,173,432 B1 | * | 1/2001 | Harriaon | 327/158 |
| 6,201,424 B1 | * | 3/2001 | Harrison | 327/159 |
| 6,265,918 B1 | * | 7/2001 | Toda | 327/146 |

FOREIGN PATENT DOCUMENTS

KR 99-0069915 9/1999

* cited by examiner

Primary Examiner—Timothy P. Callahan
Assistant Examiner—Linh Nguyen
(74) Attorney, Agent, or Firm—F. Chau & Associates, LLP

(57) ABSTRACT

A clock generating circuit for compensating for a delay difference using a closed loop analog synchronous mirror delay structure is provided. The clock generating circuit divides a delay clock signal and a reference clock signal to generate first and second divided signals, and synchronizes an internal clock signal with the reference clock signal using the first and the second divided signals, at the initial stage of an operation. After predetermined clock cycles, the clock generating circuit divides the internal clock signal to generate the first and the second divided signals. The quick synchronization of the internal clock signal with the reference clock obviates any error which may occur between the delay time of a mirror delay circuit and the delay time of an actual circuit.

20 Claims, 8 Drawing Sheets

CLOCK GENERATING CIRCUIT FOR COMPENSATION OF DELAY DIFFERENCE USING CLOSED LOOP ANALOG SYNCHRONOUS MIRROR DELAY STRUCTURE

BACKGROUND OF THE INVENTION

1. Field of the Invention

The present invention relates to an integrated circuit device, and more particularly, to a clock generating circuit for generating a clock signal synchronizing with a reference signal.

2. Description of the Related Art

Usually, a synchronous dynamic random access memory (SDRAM) includes a clock generating circuit for generating an internal clock signal synchronizing with an external clock signal. Since many operations of an SDRAM including data input/output are with reference to the internal clock signal, the clock signal generating circuit which generates the internal clock signal is an important circuit to SDRAM.

Conventionally, a phase-locked loop (PLL) or a delay-locked loop (DLL) is used in SDRAMs to synchronize an internal clock signal with an external clock signal. PLL or DLL uses a feedback circuit within SDRAM and generates an internal clock signal which derives from and synchronizes with an external clock signal.

Recently, SDRAM employs a mode for minimizing the power consumption by reducing the supply of power when an input/output operation is not performed. A state in which the supply of power is reduced is referred to as a power down mode or a sleep mode, and a mode in which an input/output operation is performed is referred to as an activated mode.

Typically, the operation of an SDRAM commence after the PLL or DLL reaches stabilization, when changing from a power down mode to an activated mode. An internal clock signal generated by the stabilized PLL or DLL is used to clock and synchronize internal circuits. Since PLL or DLL includes a feedback circuit, it usually takes from several hundreds of cycles through several thousands of cycles to stabilize the PLL or DLL. The time required for stabilizing PLL or DLL greatly affects the operating speed of an entire system.

Hence, circuit designers have sought effective clock synchronization methods which change from a power down mode to an activated mode rapidly and consume a small amount of power, especially in power down mode. One of these methods is a synchronous mirror delay method, which duplicates internal electrostatic capacity of an SDRAM and delay time with respect to the characteristics of an input/output multiplexer within SDRAM by using an internal mirror delay circuit. With the copied capacity and delay time, the synchronous mirror delay method controls the input/output signal of SDRAM.

A synchronous mirror delay method is disclosed by Saeki et al. in "A 2.5 ns Clock Access 250 MHz 256 Mb SDRAM With a Synchronous Mirror Delay", IEEE J. Solid State Circuits, vol. 31, pp. 1656–1664, November 1996. According to this synchronous mirror delay method, the time required for the DLL of a clock generator to be stabilized is reduced to two cycles.

The synchronous mirror delay method disclosed by Saeki et al. is implemented by a digital circuit, which digitizes and duplicates the internal electrostatic capacity of SDRAM and a delay time based on characteristics of an input/output multiplexer within an SDRAM. However, during a digitizing process, quantization errors may occur.

A method to solve the above described problem is disclosed in the commonly assigned Korean Patent Application No. 98-34882, entitled "Internal Clock Generating Circuit with Analog Pumping Structure." The disclosure in its entirety of Korean Patent Application No. 34882 is incorporated by reference herein. The invention disclosed in Korean Patent Application No. 34882 eliminates the delay error of an output clock due to a quantization error.

However, even the mirror delay circuit disclosed in the Korea Patent Application No. 34882 may not accurately mirror a desired delay time when there are changes in fabrication conditions such as temperature and pressure. The difference between the delay time of a mirror delay circuit and the delay time of an actual circuit may cause synchronization error of an internal clock signal against an external clock signal, and may further decrease the operating speed of the SDRAM.

SUMMARY OF THE INVENTION

To solve the above problems, it is an objective of the present invention to provide a clock generating circuit which generates an internal clock signal synchronizing with an external clock signal within a short time, wherein the clock generating circuit rapidly eliminates the error between the internal clock signal and the external clock signal which may occur between the delay time of a mirror delay circuit and the delay time of an actual circuit.

Accordingly, to achieve the above objective, there is provided a clock generating circuit for generating an internal clock signal synchronizing with an external clock signal. The clock generating circuit includes a controller for receiving the internal clock signal and the reference clock signal and generating first and second divided signals, wherein the first and the second divided signals have different phases and a $1/(2N)$ (N is a natural number) frequency of the reference clock signal; a linear current pump for generating first and second pumping signals in response to the first and the second divided signals, wherein each of the first and the second pumping signals has a level-up time rate and a level-down time rate which are the same; and a fast comparator for providing a pre-clock signal for generating the internal clock signal, in response to the first and the second pumping signals, wherein the pre-clock signal responds to a voltage level based on at least one of the first and the second pumping signals with respect to a predetermined reference voltage.

In another embodiment, there is provided a clock generating circuit for generating an internal clock signal synchronizing with a reference clock signal. The clock generating circuit includes a controller for receiving the internal clock signal and the reference clock signal and generating first and second divided signals, wherein the first and the second divided signals have different phases and a $1/(2N)$ (N is a natural number) frequency of the reference clock signal; a linear current pump for generating first and second pumping signals in response to the first and the second divided signals, wherein each of the first and the second pumping signals has a level-up time rate and a level-down time rate which are the same; a fast comparator for providing a pre-clock signal in response to the first and the second pumping signals, wherein the pre-clock signal responds to a voltage level based on at least one of the first and the second pumping signals with respect to a reference voltage; a selection delay unit for delaying the pre-clock signal by a predetermined variable delay time to generate the internal clock signal; and a delay regulator for providing a duty control signal for controlling the duty ratio of the internal clock signal to the selection delay unit.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
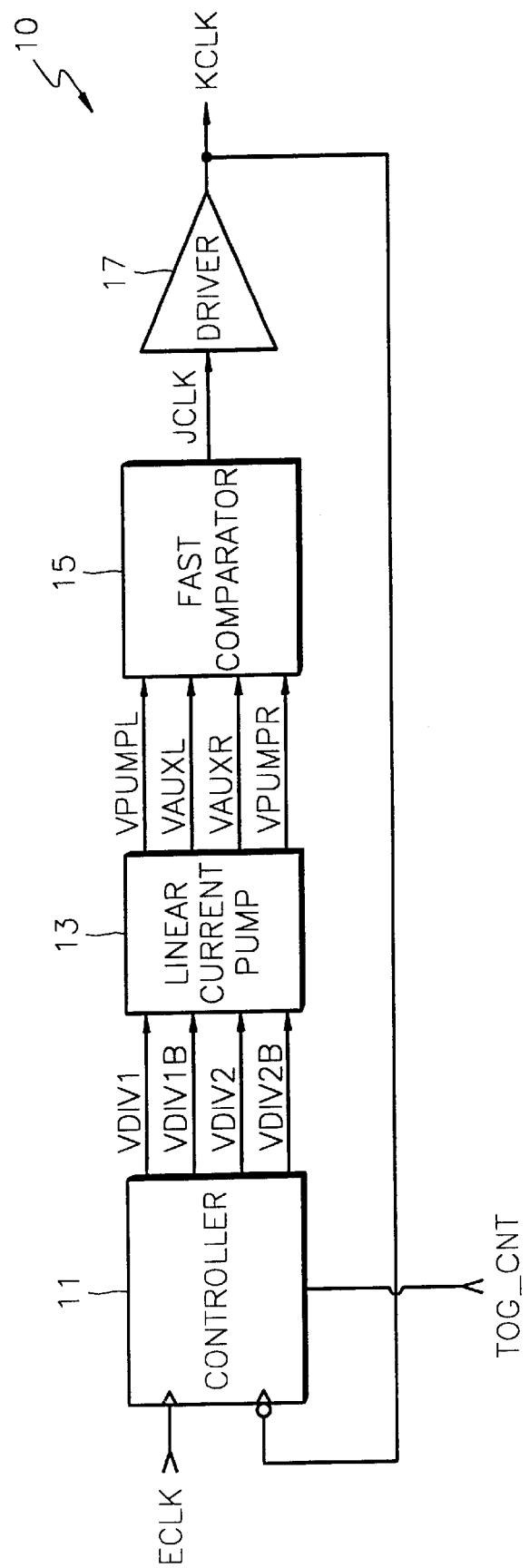
FIG. 1 is a block diagram of a clock generating circuit according to an embodiment of the present invention.

Referring to FIG. 1, a clock generating circuit 10 according to an embodiment of the present invention includes a controller 11, a linear current pump 13, a fast comparator 15 and a driver 17.

The controller 11 receives an internal clock signal KCLK and an external clock signal ECLK and generates first and second divided signals VDIV1 and VDIV2 and first and second inverted divided signals VDIV1B and VDIV2B. The first and second inverted divided signal VDIV1B and VDIV2B are the inverted signals of the first and second divided signals VDIV1 and VDIV2. The first and second divided signals VDIV1 and VDIV2 have different phases but have the same frequency. The frequency of the first and second divided signals VDIV1 and VDIV2 is half the frequency of the external clock signal ECLK.

The linear current pump 13 generates first and second pumping signals VPUMPL and VPUMPR in response to the first and second divided signals VDIV1 and VDIV2. The first and second pumping signals VPUMPL and VPUMPR have the same level-up time rate and the same level-down time rate. The level-up time rate indicates a rate at which a voltage level rises, and the level-down time rate indicates a rate at which a voltage level drops.

The fast comparator 15 provides a pre-clock signal JCLK in response to the first and second pumping signals VPUMPL and VPUMPR. When the voltage level of the first or second pumping signal VPUMPL or VPUMPR is lower than a reference voltage VREF (not shown), the pre-clock signal JCLK is activated to a "high" level.

According to the embodiment, the pre-clock signal JCLK is inputted to and driven by the driver 17 before outputting from the driver 17 as the internal clock signal KCLK. The internal clock signal KCLK outputted from the drive 17 is delayed from the pre-clock signal JCLK by a predetermined driving delay time dtd (see FIG. 7). A toggle control signal $TOG_{13}CNT$ will be described below with reference to FIG. 2.

Figure 2:
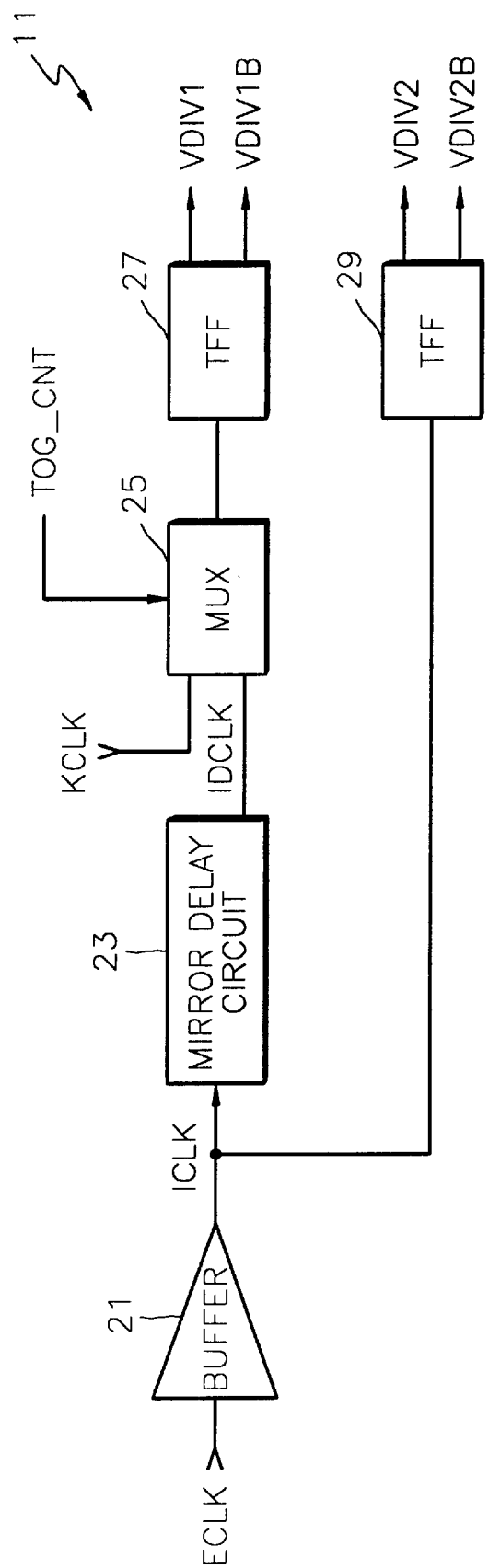
FIG. 2 is a block diagram of the controller of FIG. 1.

FIG. 2 is a detailed diagram of the controller 11 of FIG. 1. Referring to FIG. 2, the controller 11 includes a buffer 21, a mirror delay circuit 23, a multiplexer (MUX) 25, a first divider 27 and a second divider 29.

The external clock signal ECLK inputted from the outside is buffered by the buffer 21 and generated as a reference clock signal ICLK. Alternatively, the external clock signal ECLK may directly be the reference clock signal ICLK without the buffer 21.

The mirror delay circuit 23 delays the reference clock signal ICLK by a predetermined mirror delay time dtm (see FIG. 7) to generate a delay clock signal IDCLK. Preferably, the mirror delay time dtm is equal to the driving delay time dtd. However, the driving delay time dtd and the mirror delay time dtm may be different due to variations in fabrication conditions such as temperature and pressure. Accordingly, it is assumed that the driving delay time dtd is different from the mirror delay time dtm in this specification.

The MUX 25 selects one of the delay clock signal IDCLK and the internal clock signal KCLK in response to the toggle control signal TOG_CNT and outputs the selected signal to the first divider 27. At the initial stage of operation, the toggle control signal TOG_CNT is maintained at a "low" level, the MUX 25 selects and outputs the delay clock signal IDCLK when TOG_CNT is low. After predetermined clock cycles (for example, 4 clock cycles) from the beginning of the first stage of operation, the toggle control signal TOG_CNT changes into a "high" level, the MUX 25 selects and outputs the internal clock signal KCLK when TOG_CONT is high.

The first divider 27 divides the frequency of the delay clock signal IDCLK or the frequency of the internal clock signal KCLK by 2 to generate the first divided signal VDIV1 and the first inverted divided signal VDIV1B. Preferably, the first divider 27 is a T flip-flop (TFF) which has the delay clock signal IDCLK or the internal clock signal KCLK as an input and generates the first divided signal VDIV1 and the first inverted divided signal VDIV1B as output signals.

The second divider 29 divides the frequency of the reference clock signal ICLK by 2 to generate the second divided signal VDIV2 and the second inverted divided signal VDIV2B. Preferably, the second divider 29 is a T flip-flop (TFF) which has the reference clock signal ICLK as an input and generates the second divided signal VDIV2 and the second inverted divided signal VDIV2B as output signals.

Figure 3:
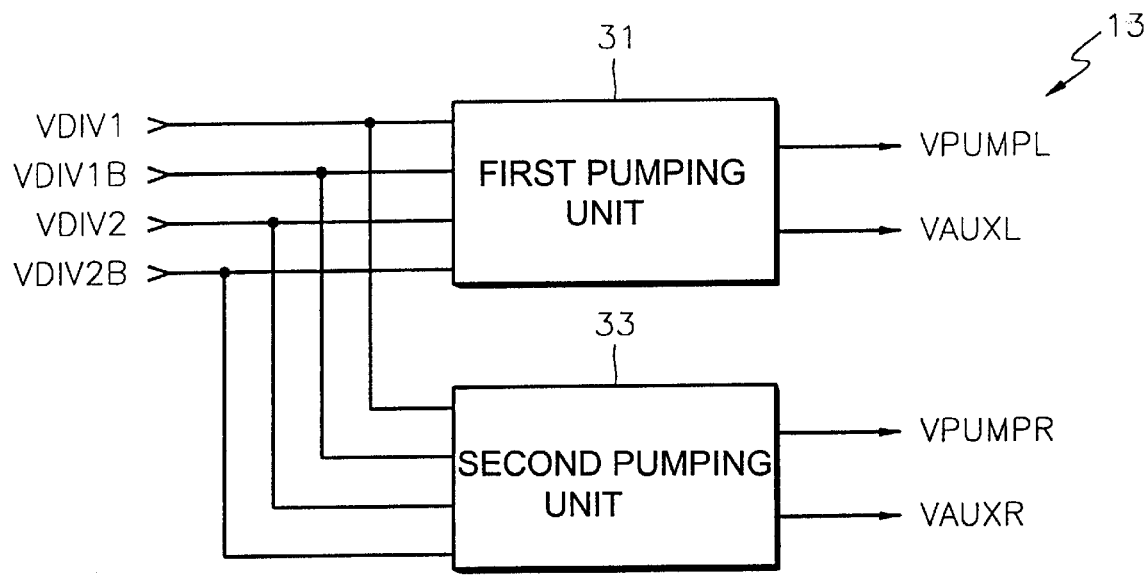
FIG. 3 is a diagram of a linear current pump of FIG. 1.

FIG. 3 is a diagram of the linear current pump 13 of FIG. 1. Referring to FIG. 3, the linear current pump 13 includes first and second pumping units 31 and 33. The first pumping unit 31 provides the first pumping signal VPUMPL and a first auxiliary signal VAUXL in response to the first and second divided signals VDIVI and VDIV2. The second pumping unit 33 provides the second pumping signal VPUMPR and a second auxiliary signal VAUXR in response to the first and second divided signals VDIV1 and VDIV2.

Figure 4:
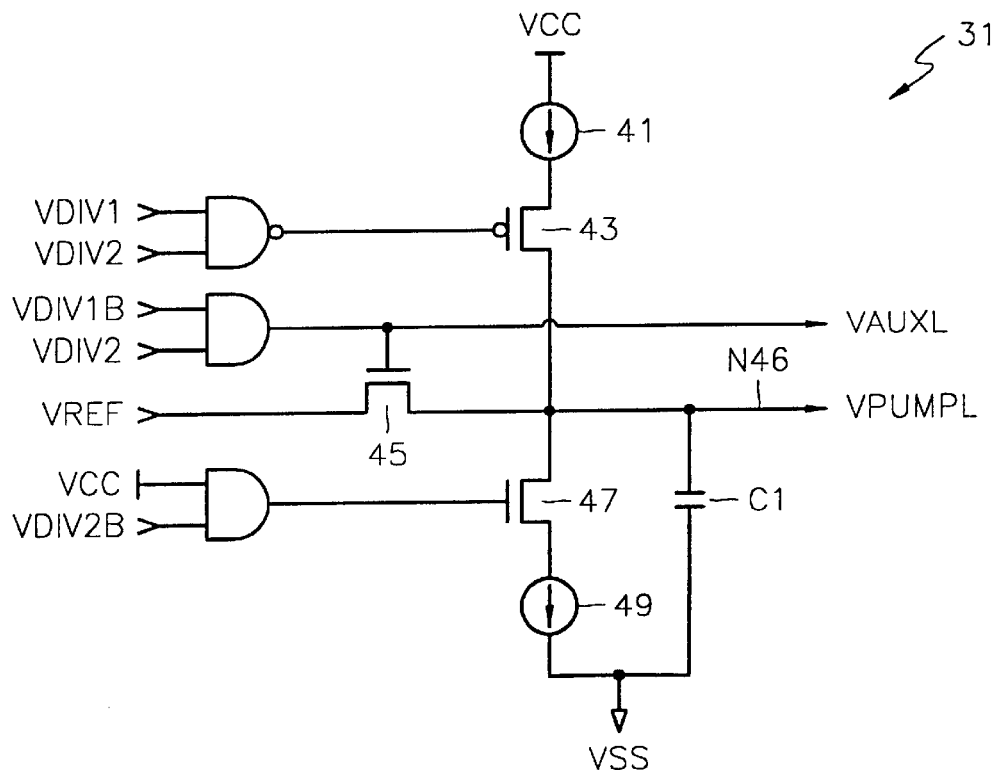
FIG. 4 is a detailed circuit diagram of the first pumping unit of FIG. 3.

FIG. 4 is a detailed circuit diagram of the first pumping unit 31 of FIG. 3. Referring to FIG. 4, the first pumping unit 31 includes a pumping signal terminal N46, switching transistors 43, 45 and 47, a current source 41, a current sink 49 and a capacitor C1.

The pumping signal terminal N46 provides the first pumping signal VPUMPL. The first pumping signal VPUMPL is pre-charged to a voltage level equal to a reference voltage VREF in a section in which the second divided signal VDIV2 is activated to a "high" level and the first divided signal VDIV1 is deactivated to a "low" level (the first inverted divided signal VDIV1B is "high"). In the section in which the second divided signal VDIV2 is "high" and the first divided signal VDIV1 is "low", the switching transistor 45 is turned on so that the pumping signal terminal N46 is connected to the reference voltage VREF. Accordingly, the voltage level of the first pumping signal VPUMPL becomes equal to the reference voltage VREF. In this case, the first auxiliary signal VAUXL becomes "high".

The current source 41 supplies current from supply voltage VCC to the pumping signal terminal N46. When the first and second divided signals VDIV1 and VDIV2 all become "high", the switching transistor 43 is turned on so that the pumping signal terminal N46 is connected to the current source 43. Accordingly, the voltage level of the first pumping signal VPUMPL rises. In this case, the voltage level of the first pumping signal VPUMPL rises at a first time changing rate.

The current sink 49 discharges the current from the pumping signal terminal N46 to ground voltage VSS. When the second inverted divided signal VDIV2B becomes "high", the switching transistor 47 is turned on so that the pumping signal terminal N46 is coupled to the current sink 49. The discharge rate of the current sink 49 is equal to the supply rate of the current source 41. Accordingly, the voltage level of the first pumping signal VPUMPL falls at the first time changing rate.

The capacitor C1 is provided between the pumping signal terminal N46 and the ground voltage VSS to prevent the voltage level of the first pumping signal VPUMPL from rapidly rising or falling.

Figure 5:
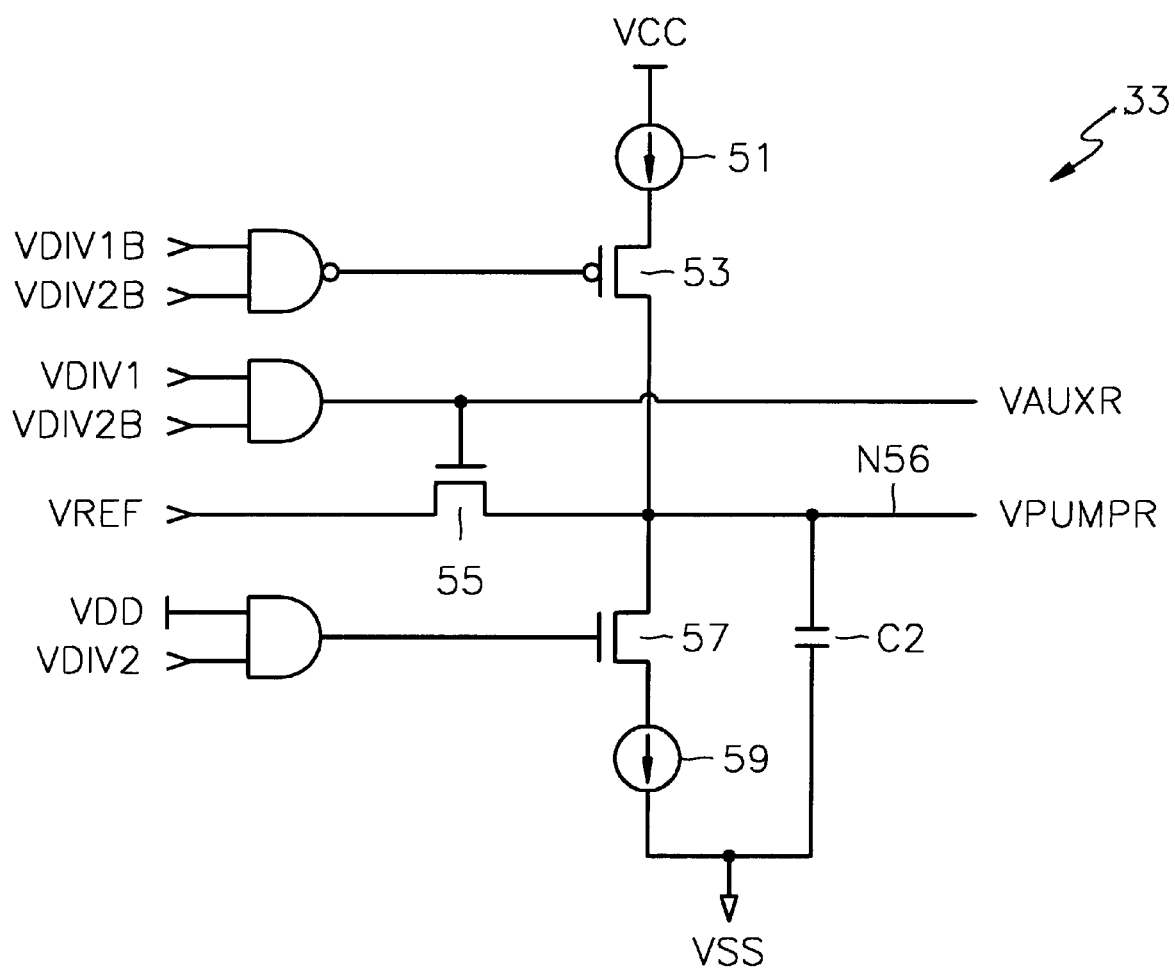
FIG. 5 is a detailed circuit diagram of the second pumping unit of FIG. 3.

FIG. 5 is a detailed circuit diagram of the second pumping unit 33 of FIG. 3. Referring to FIG. 5, the second pumping unit 33 includes a pumping signal terminal N56, switching transistors 53, 55 and 57, a current source 51, a current sink 59 and a capacitor C2.

The pumping signal terminal N56 provides the second pumping signal VPUMPR. The second pumping signal VPUMPR is pre-charged to a voltage level equal to a reference voltage VREF in a section in which the first divided signal VDIV1 is activated to a "high" level and the second divided signal VDIV2 is deactivated to a "low" level (the second inverted divided signal VDIV2B is "high"). In the section in which the first divided signal VDIV1 is "high" and the second divided signal VDIV2 is "low", the switching transistor 55 is turned on so that the pumping signal terminal N56 is coupled to the reference voltage VREF. Accordingly, the voltage level of the second pumping signal VPUMPR becomes equal to the reference voltage VREF. In this case, the second auxiliary signal VAUXR goes to "high".

The current source 51 supplies current from supply voltage VCC to the pumping signal terminal N56. When the first and second divided signals VDIV1 and VDIV2 all go to "low" (the first and second inverted divided signals VDIV1B and VDIV2B all go to "high"), the switching transistor 53 is turned on so that the pumping signal terminal N56 is coupled to the current source 51. Accordingly, the voltage level of the second pumping signal VPUMPR rises. In this case, the voltage level of the second pumping signal VPUMPR rises at a second time changing rate.

The current sink 59 discharges the current from the pumping signal terminal N56 to ground voltage VSS. When the second divided signal VDIV2 goes to "high", the switching transistor 57 is turned on so that the pumping signal terminal N56 is coupled to the current sink 59. The discharge rate of the current sink 59 is equal to the supply rate of the current source 51. Accordingly, the voltage level of the second pumping signal VPUMPR falls at the second time changing rate.

According to the preferred embodiment, the first time changing rate is identical to the second time changing rate. The capacitor C2 is provided between the pumping signal terminal N56 and the ground voltage VSS to prevent the voltage level of the second pumping signal VPUMPR from rapidly rising or falling.

Figure 6:
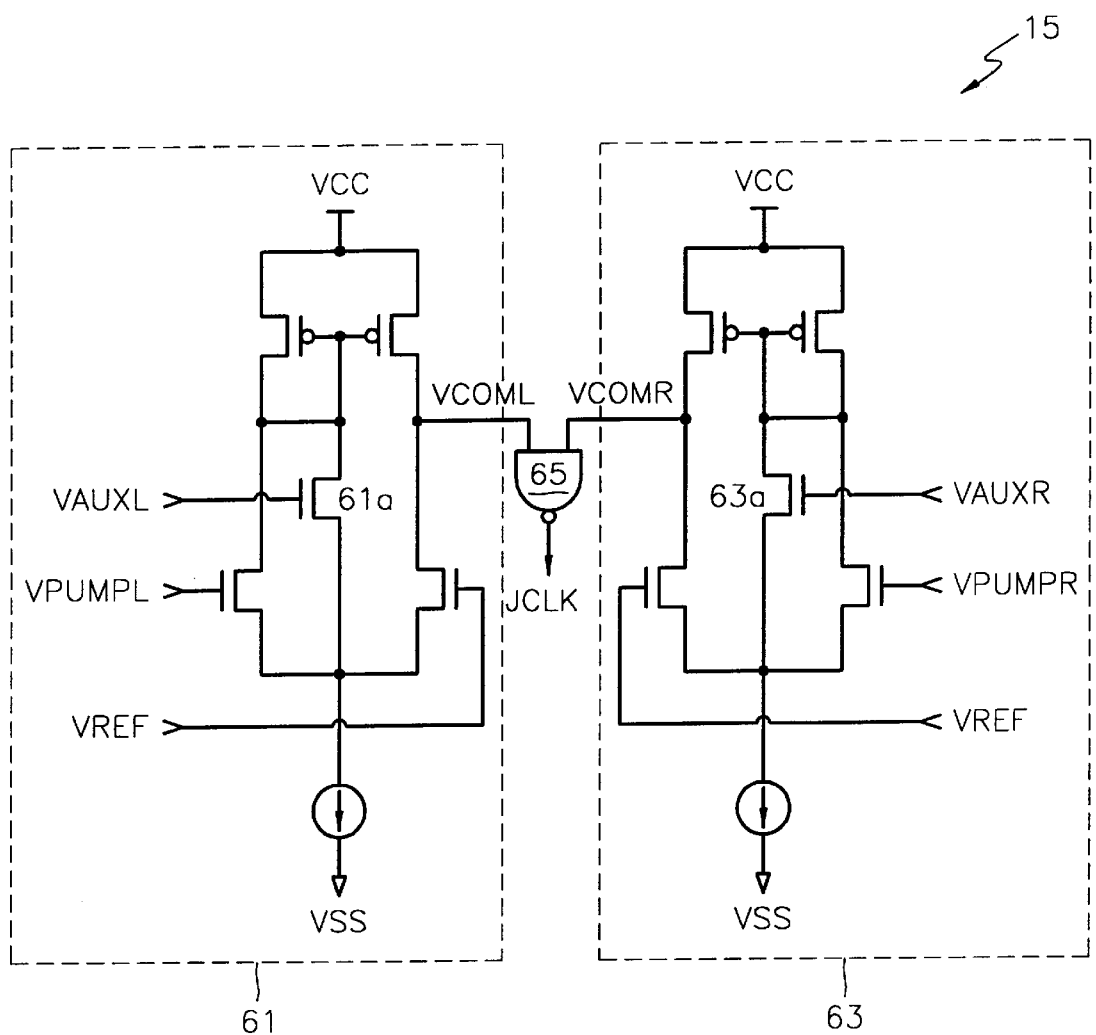
FIG. 6 is a detailed circuit diagram of the fast comparator of FIG. 1.

FIG. 6 is a detailed circuit diagram of the fast comparator 15 of FIG. 1. Referring to FIG. 6, the fast comparator 15 includes a first comparator 61, second comparator 63 and a logic operation unit 65.

The first comparator 61 compares the voltage level of the first pumping signal VPUMPL with the reference voltage VREF to generate a first comparison signal VCOML. When the voltage level of the first pumping signal VPUMPL is higher than the reference voltage VREF, the first comparison signal VCOML goes to a high voltage level. On the other hand, when voltage level of the first pumping signal VPUMPL is lower than the reference voltage VREF, the first comparison signal VCOML goes to a low voltage level.

The first auxiliary signal VAUXL is "high" while the first pumping signal VPUMPL is being pre-charged to the reference voltage VREF. Accordingly, while the voltage level of the first pumping signal VPUMPL is being the reference voltage VREF, an NMOS transistor 61a is turned on and the voltage level of the first comparison signal VCOML is prevented from being unstable.

The second comparator 63 has similar configuration and operational effect to the first comparator 61. Thus, the description of the configuration and operational effect of the second comparator 63 is omitted. The difference between the first and second comparators 61 and 63 is that the second comparator 63 compares the voltage level of the second pumping signal VPUMPR with the reference voltage VREF to generate a second comparison signal VCOMR.

The logic operation unit 65 compares the first comparison signal VCOML with the second comparison signal VCOMR to generate the pre-clock signal JCLK. The logic operation unit 65 can be implemented by a NAND gate. Therefore, when the voltage level of the first or second pumping signal VPUMPL or VPUMPR is lower than the reference voltage VREF, the pre-clock signal JCLK is activated to a "high" level.

Figure 7:
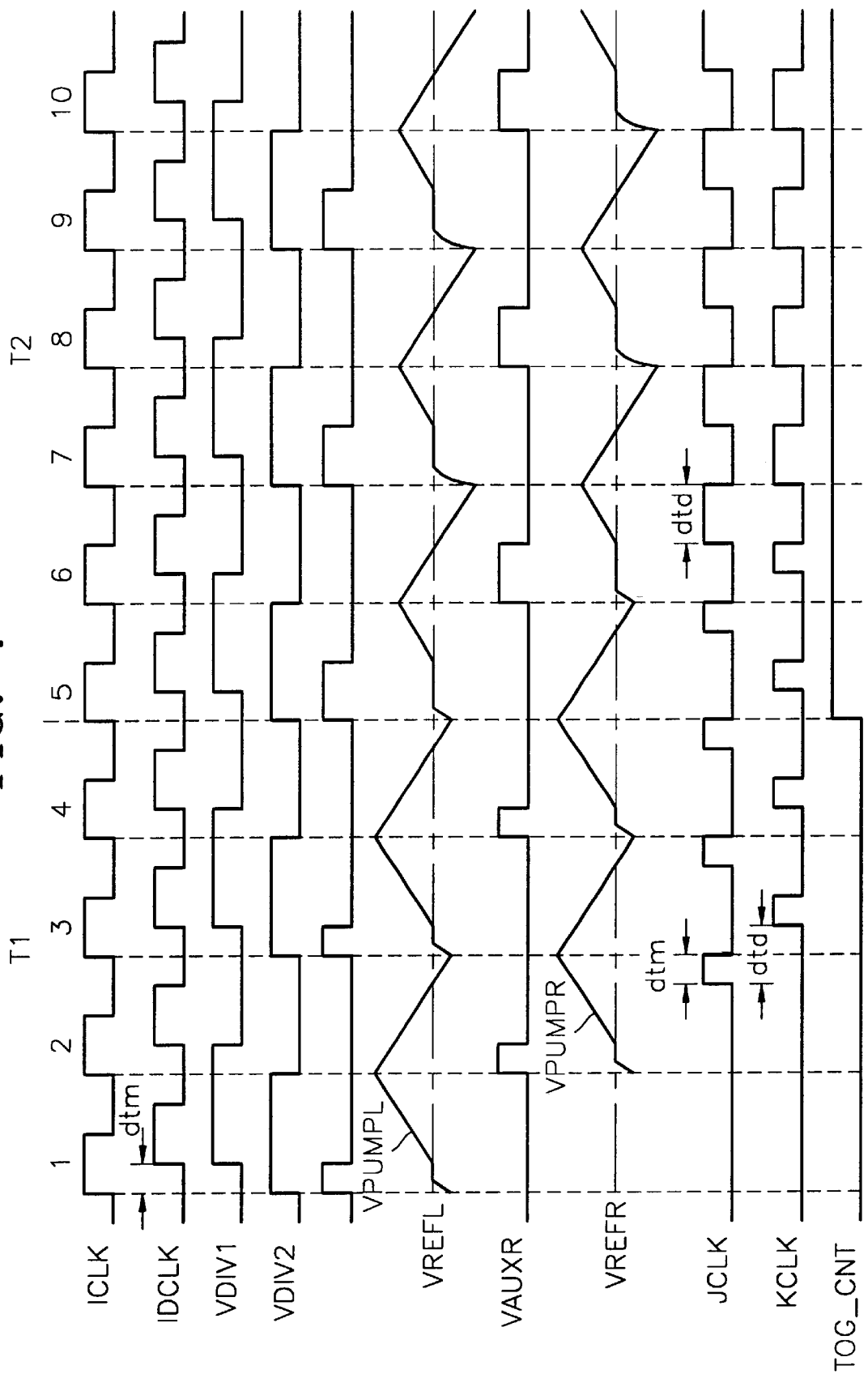
FIG. 7 is a timing chart of main terminals of the clock generating circuit of FIG. 1.

FIG. 7 is a timing chart of main terminals of the clock generating circuit of FIG. 1. And the operational effect of the clock generating circuit 10 of FIG. 1 is described.

With regard to the operational effect of the clock generating circuit 10 in a section T1 (the initial stage of the operation), the delay clock signal IDCLK and the reference clock signal ICLK are divided by 2, respectively. And thus, the first divided signal VDIV1 and the second divided signal VDIV2 are generated. The pre-clock signal JCLK maintains a "high" level while the voltage level of the first or second pumping signal VPUMPL or VPUMPR is being lower than the reference voltage VREF. Accordingly, the width of a section in which the pre-clock signal JCLK maintains the "high" level is identical to the width of the mirror delay time dtm of the mirror delay circuit 23 of FIG. 2. Hence, as shown in FIG. 7, the falling edge of the pre-clock signal JCLK is locked to the rising edge of the reference clock signal ICLK. The locking occurs about every two cycle.

The pre-clock signal JCLK is delayed by the driving delay time dtd by the driver 17 and then generated as the internal clock signal KCLK. When the driving delay time dtd is the same as the mirror delay time dtm, the rising edge of the internal clock signal KCLK can be accurately coincident with the rising edge of the reference clock signal ICLK. On the other hand, when the driving delay time dtd is different from the mirror delay time dtm, the rising edge of the internal clock signal KCLK cannot be coincident with the rising edge of the reference clock signal ICLK.

To eliminate the difference between the internal clock signal KCLK and the reference clock signal ICLK which may occur when the driving delay time dtd is not the same as the mirror delay time dtm, the toggle control signal TOG_CNT is activated to a "high" level. The operational effect of the clock generating circuit 10 in a section T2 (the second stage of operation) in which the toggle control signal TOG_CNT is being activated to the "high" level is described below.

When the toggle control signal TOG_CNT goes to "high", the first divider 27 divides the internal clock signal KCLK instead the delay clock signal IDCLK by 2 to generate the first divided signal VDIV1. Then, a section in which the first or second pumping signal VPUMPL or VPUMPR is pre-charged to the reference voltage VREF corresponding to the driving delay time dtd. A section in which voltage level of the first or second pumping signal VPUMPL or VPUMPR is lower than the reference voltage VREF also corresponds to the driving delay time dtd. Accordingly, the pre-clock signal JCLK is "high" prior to the reference clock signal ICLK by the driving delay time dtd and goes to "low" at the rising edge of the reference clock signal ICLK. Therefore, the rising edge of the internal clock signal KCLK which is delayed by the driving delay time dtd from the pre-clock signal JCLK can be accurately coincident with the rising edge of the reference clock signal ICLK.

As described previously, the width of a section in which the internal clock signal KCLK is activated to a "high" level is the same as the driving delay time dtd by the driver 17 of FIG. 1. Accordingly, a duty cycle of the internal clock signal KCLK is determined in accordance with the driving delay time dtd by the driver 17.

The driving delay time dtd may vary according to the change in fabrication conditions such as temperature and pressure. Therefore, to generate the internal clock signal KCLK having an accurate duty, a circuit for regulating the driving delay time dtd is required. An example including the circuit for regulating the driving delay time dtd is shown in FIG. 8.

Figure 8:
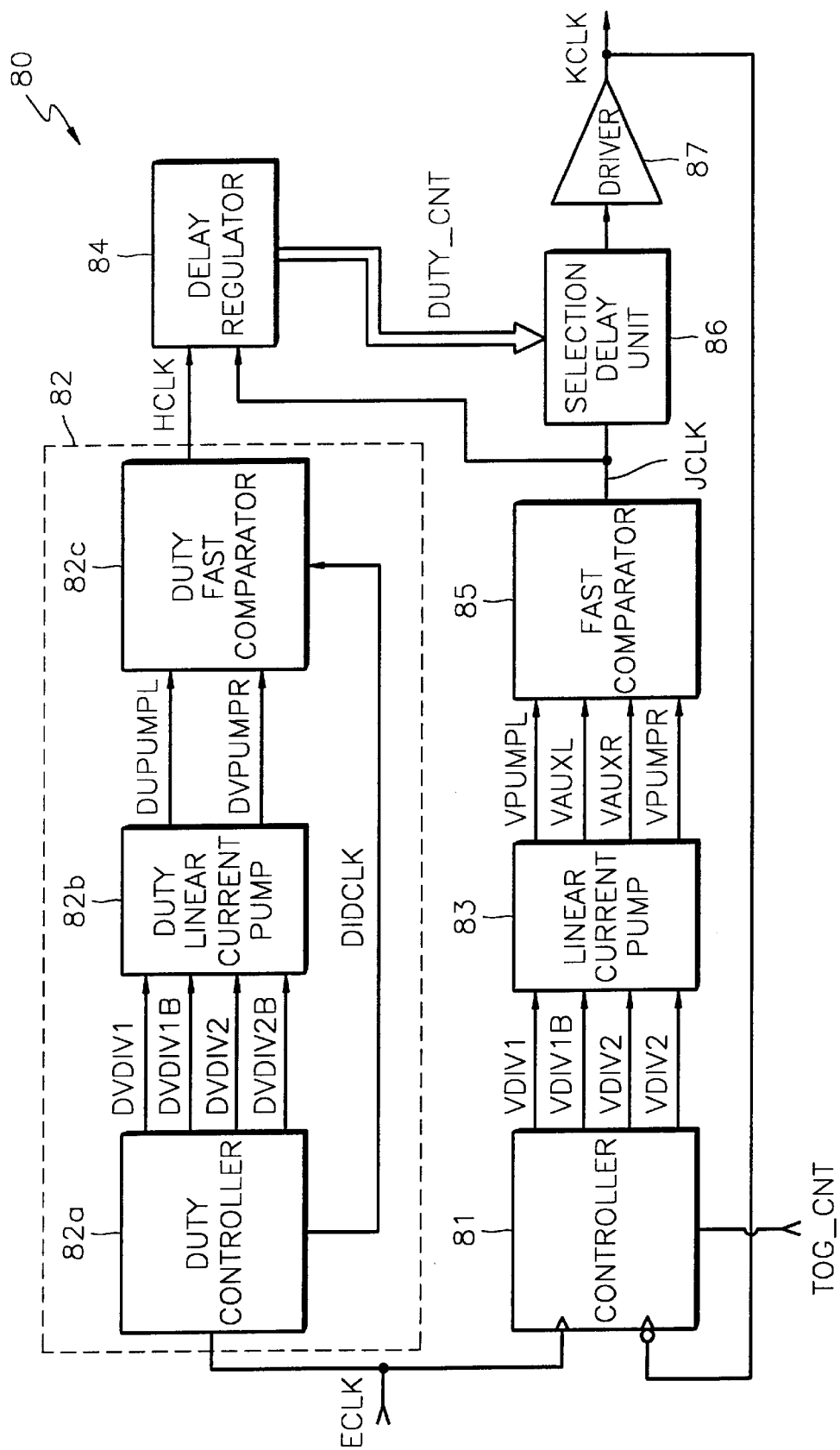
FIG. 8 is a block diagram of a clock generating circuit according to another embodiment of the present invention.

FIG. 8 is a schematic diagram of a clock generating circuit according to another embodiment of the present invention. Referring to FIG. 8, the clock generating circuit 80 includes a selection delay unit 86 for regulating a delay time from a pre-clock signal JCLK to an internal clock signal KCLK and a delay regulator 84 in addition to a controller 81, a linear current pump 83, a fast comparator 85 and a driver 87.

In FIG. 8, the controller 81, the linear current pump 83, the fast comparator 85 and the driver 87 have the similar configuration and operational effects as those of the corresponding elements of the clock generating circuit 10 in FIG. 1. Thus, the description of the configuration and operational effects of these same elements is omitted. The same reference characters in the embodiment in FIG. 1 also shown in FIG. 8 include an external clock signal ECLK, an internal clock signal KCLK and a pre-clock signal JCLK.

The embodiment of FIG. 8 differs from the embodiment of FIG. 1 by further including the duty reference signal generator 82, the delay regulator 84 and the selection delay unit 86.

The selection delay unit 86 delays the pre-clock signal JCLK by a variable delay time dtv and provides the delay to the driver 87. The variable delay time dtv is controlled by a duty control signal DUTY_CNT.

The delay regulator 84 receives a duty reference signal HCLK and the pre-clock signal JCLK and generates the duty control signal DUTY_CNT. The delay regulator 84 provides the duty control signal DUTY_CNT to the selection delay unit 86 to regulate the variable delay time dtv such that the duty ratio of the internal clock signal KCLK is identical to the duty ratio of the duty reference signal HCLK.

The selection delay unit 86 and the delay regulator 84 can be easily implemented by those skilled in the art. Therefore, the description of their configurations is omitted.

The duty reference signal generator 82 receives the external clock signal ECLK and generates the duty reference signal HCLK. The duty reference signal generator 82 includes a duty controller 82a, a duty linear current pump 82b and a duty fast comparator 82c.

According to the preferred embodiment, the duty controller 82a and the duty linear current pump 82b have similar configuration and operational effect as the controller 11 and the linear current pump 13 of FIG. 1, respectively. Thus, the duty controller 82a and the duty linear current pump 82b will be described focusing on the differences.

The duty controller 82a receives the external clock signal ECLK and generates first and second duty divided signals DVDIV1 and DVDIV2. The duty controller 82a will be described in more detail with reference to FIG. 9.

Figure 9:
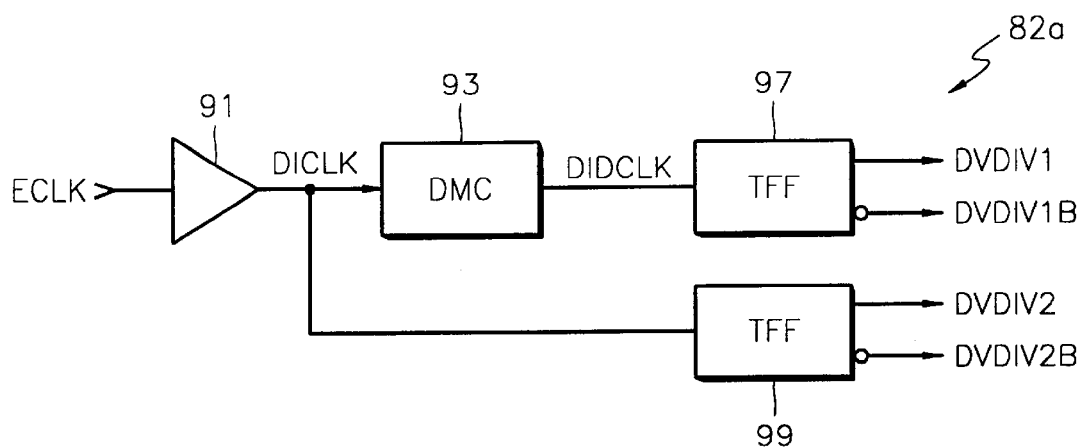
FIG. 9 is a block diagram of the duty controller of FIG. 8.

FIG. 9 is a detailed diagram of the duty controller 82a of FIG. 8. Referring to FIG. 9, the duty controller 82a is similar to the controller 11 of FIG. 2. However, while the first divider 27 of the controller 11 divides one signal, which is selected from the delay clock signal IDCLK and the internal clock signal KCLK in response to the toggle control signal TOG_CNT, by 2, a first divider 97 of the duty controller 82a divides only a delay clock signal DIDCLK by 2.

Referring back to FIG. 8, the duty linear current pump 82b generates first and second duty pump signals DVPUMPL and DVPUMPR in response to the first and second duty divided signals DVDIV1 and DVDIV2. The duty linear current pump 82b has similar configuration and operational effect as the linear current pump 13 depicted in FIGS. 3 through 5 and thus the description of configuration and operational effect of the duty linear current pump 82b is omitted.

The duty fast comparator 82c generates the duty reference signal HCLK in response to the first and second pumping signals DVPUMPL and DVPUMPR. The configuration of the duty fast comparator 82c will be described in more detail with reference to FIG. 10.

Figure 10:
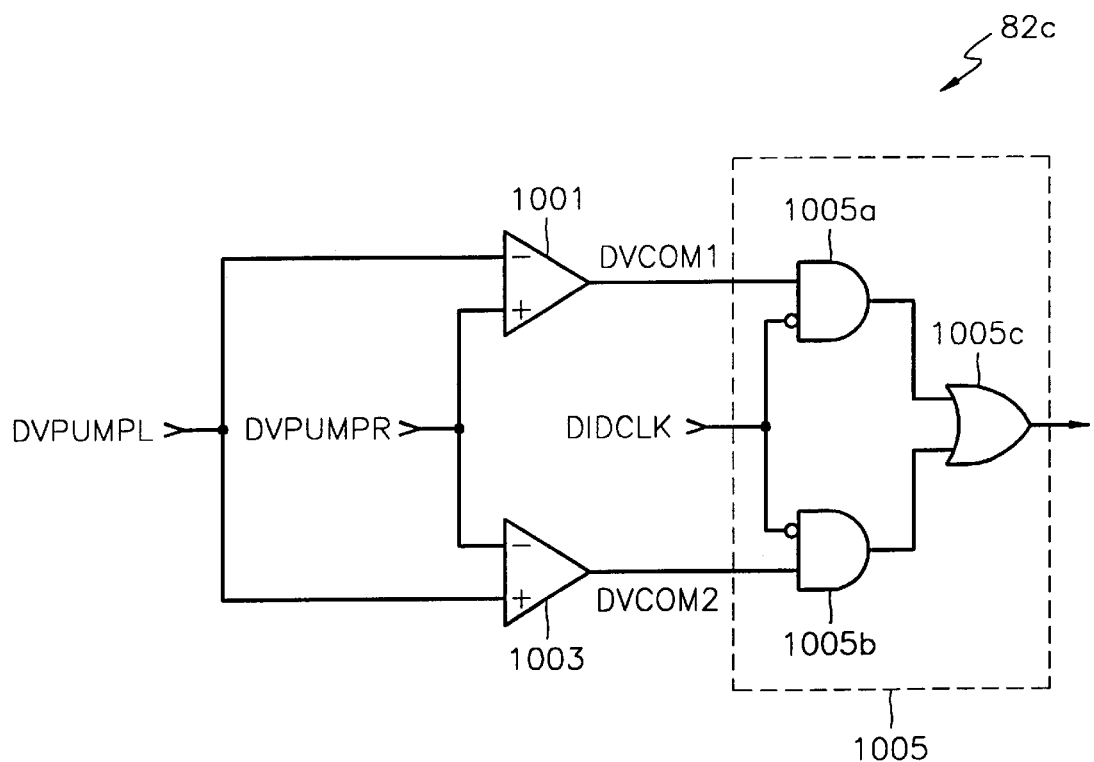
FIG. 10 is a detailed circuit diagram of the duty fast comparator of FIG. 8.

FIG. 10 is a detailed circuit diagram of the duty fast comparator 82c of FIG. 8. Referring to FIG. 10, the duty fast comparator 82c includes a first comparator 1001, a second comparator 1003 and a logic operation unit 1005. The first comparator 1001 receives the first duty pumping signal DVPUMPL via the negative input terminal and the second duty pumping signal DVPUMPR via the positive input terminal and compares the voltage levels of them to generate a first duty comparison signal DVCOM1. The second comparator 1003 receives the first duty pumping signal DVPUMPL via the positive input terminal and the second duty pumping signal DVPUMPR via the negative input terminal and compares the voltage levels of them to generate a second duty comparison signal DVCOM2.

The logic operation unit 1005 is enabled when the delay clock signal DIDCLK is "low". The logic operation unit 1005 performs an OR operation on the first and second duty-comparison signals DVCOM1 and DVCOM2 to provide the duty reference signal HCLK. Preferably, the logic operation unit 1005 includes two AND gates 1005a and 1005b and an OR gate 1005c. Accordingly, the duty reference signal HCLK has the same duty ratio as the external clock signal ECLK. Preferably, the duty ratio of the duty reference signal HCLK is 50%.

Referring back to FIG. 8, the delay regulator 84 compares the duty ratio of the duty reference signal HCLK and the duty ratio of the pre-clock signal JCLK thereto provide the duty control signal DUTY_CNT to the selection delay unit 86. When the duty ratio of the internal clock signal KCLK is larger than the duty ratio of the external clock signal ECLK, the duty control signal DUTY_CNT controls the selection delay unit 86 so as to decrease the delay time. On the other hand, when the duty ratio of the internal clock signal KCLK is smaller than the duty ratio of the external clock signal ECLK, the duty control signal DUTY_CNT controls the selection delay unit 86 so as to increase the delay time. In such processes, the duty ratio of the internal clock signal KCLK can be identical to the duty ratio of the external clock signal ECLK.

While this invention has been particularly shown and described with reference to preferred embodiments thereof, it will be understood by those skilled in the art that various modifications in form and details may be realized therein. For example, in this specification, a clock generating circuit for synchronizing the internal clock signal KCLK with the reference clock signal ICLK is disclosed. However, it is obvious to those skilled in the art that the internal clock signal KCLK can be synchronized with the external clock signal ECLK when, instead of the reference clock signal ICLK, the external clock signal ECLK is inputted to the second divider 29 in the controller 11 of FIG. 2. Accordingly, the technical scope of the present invention should be defined by the spirit of the scope of the appended claims.

According to a clock generating circuit of the present invention, an internal clock signal synchronizing with an external clock signal or a reference clock signal within a short time can be provided. In addition, even though an error occurs between the delay time of a mirror delay circuit and the delay time of an actual circuit, the error can be rapidly removed. Moreover, the duty ratio of the internal clock signal can be identical to the duty ratio of the external clock signal or the reference clock signal.

What is claimed is:
1. A clock generating circuit for generating an internal clock signal synchronizing with a reference clock signal, the clock generating circuit comprising:
a mirror delay circuit for receiving the reference clock signal and delaying the reference clock signal by a predetermined mirror delay time to generate a delay clock signal;
a multiplexer for selecting and outputting one of the delay clock signal and the internal clock signal in response to a predetermined toggle control signal;
a first divider for dividing the signal transmitted from the multiplexer by 2 to generate a first divided signal;
a second divider for dividing the reference clock signal by 2 to generate a second divided signal;
a linear current pump for generating first and second pumping signals in response to the first and the second divided signals, wherein each of the first and the second pumping signals has a level-up time rate and a level-down time rate which are the same; and
a fast comparator for providing a pre-clock signal for generating the internal clock signal, in response to the first and the second pumping signals, wherein the pre-clock signal responds to a voltage level of one of the first and the second pumping signals with respect to a predetermined reference voltage.

2. The clock generating circuit of claim 1, wherein N is 1.

3. The clock generating circuit of claim 1, wherein the first divided signal is obtained by dividing one of a delay clock signal and the internal clock signal by 2N, the delay clock signal being obtained by delaying the reference clock signal by a predetermined delay time, and the second divided signal is obtained by dividing the reference clock signal by 2N.

4. The clock generating circuit of claim 1, wherein the voltage level of the first pumping signal rises at a predetermined first time changing rate in response to the rising edge of the first divided signal and falls at the first time changing rate in response to the falling edge of the second divided signal, and the voltage level of the second pumping signal rises at a predetermined second time changing rate in response to the falling edge of the first divided signal and falls at the second time changing rate in response to the rising edge of the second divided signal.

5. The clock generating circuit of claim 4, wherein the first time changing rate is identical to the second time changing rate.

6. The clock generating circuit of claim 1, wherein the internal clock signal is activated when the voltage level of at least one of the first and the second pumping signals is lower than the reference voltage level.

7. The clock generating circuit of claim 1, wherein the multiplexer outputs the delay clock signal in a first stage of operation and outputs the internal clock signal in a second stage of operation after predetermined clock cycles from the beginning of the first stage of operation.

8. The clock generating circuit of claim 1, wherein the first and the second dividers are T flip-flops.

9. The clock generating circuit of claim 1, wherein the linear current pump comprises:
a first pumping unit for receiving the first and the second divided signals and generating the first pumping signal, wherein the first pumping signal is controlled to be at a reference voltage level when the first divided signal is in a first logic state and the second divided signal is in a second logic state, wherein the voltage level of the first pumping signal rises at a first-time changing rate in response to the transition of the second logic state of the first divided signal and falls at the first-time changing rate in response to the transition of the first logic state of the second divided signal; and
a second pumping unit for receiving the first and the second divided signals and generating the second pumping signal, wherein the second pumping signal is controlled to be at a reference voltage level when the first divided signal is in the second logic state and the second divided signal is in the first logic state, wherein the voltage level of the second pumping signal rises at a second-time changing rate in response to the transition of the first logic state of the first divided signal and falls at the second-time changing rate in response to the transition of the second logic state of the second divided signal.

10. The clock generating circuit of claim 9, wherein the first-time changing rate is identical to the second-time changing rate.

11. The clock generating circuit of claim 1, wherein the fast comparator comprises:
   a first comparator for comparing a voltage level of the first pumping signal with the reference voltage to generate a first comparison signal;
   a second comparator for comparing a voltage level of the second pumping signal with the reference voltage to generate a second comparison signal; and
   a logic operation unit for performing a logic operation on the first and the second comparison signals to provide the pre-clock signal.

12. The clock generating circuit of claim 1, further comprising a driver for driving the pre-clock signal to generate the internal clock signal.

13. A clock generating circuit for generating an internal clock signal synchronizing with a reference clock signal, the clock generating circuit comprising:
   a controller for receiving the internal clock signal and the reference clock signal and generating first and second divided signals, wherein the first and the second divided signals have different phases and a 1/(2N) (N is a natural number) frequency of the reference clock signal;
   a linear current pump for generating first and second pumping signals in response to the first and the second divided signals, wherein each of the first and the second pumping signals has a level-up time rate and a level-down time rate which are the same;
   a comparator for providing a pre-clock signal in response to the first and the second pumping signals, wherein the pre-clock signal responds to a voltage level of one of the first and the second pumping signals with respect to a reference voltage;
   a selection delay unit for delaying the pre-clock signal by a predetermined variable delay time to generate the internal clock signal; and
   a delay regulator for providing a duty control signal for controlling the duty ratio of the internal clock signal to the selection delay unit.

14. The clock generating circuit of claim 13, wherein the delay regulator generates the duty control signal in response to the pre-clock signal and a predetermined duty reference signal to control the duty ratio of the internal clock signal to be identical to the duty ratio of the reference clock signal.

15. The clock generating circuit of claim 14, further comprising a duty reference signal generator for generating the duty reference signal.

16. The clock generating circuit of claim 15, wherein the duty reference signal generator comprises:
   a duty controller for receiving the reference clock signal and generating first and second duty divided signals, wherein the first and the second duty divided signals have different phases and a 1/(2N) frequency of the reference clock signal;
   a duty linear current pump for generating first and the second duty pumping signals in response to the first and the second duty divided signals, wherein each of the first and the second duty pumping signals has a level-up time rate and a level-down time rate which are the same; and
   a duty fast comparator for generating the duty reference signal in response to the first and the second duty pumping signals.

17. The clock generating circuit of claim 16, wherein the duty controller comprises:
   a mirror delay circuit for receiving the reference clock signal and delaying it a predetermined mirror delay time to generate a delay clock signal;
   a first divider for dividing the delay clock signal by 2; and
   a second divider for dividing the reference clock signal by 2.

18. The clock generating circuit of claim 17, wherein the duty fast comparator comprises:
   a comparing circuit for comparing the first duty pumping signal with the second duty pumping signal to generate first and second duty comparison signals having opposite logic states; and
   a logic operation unit which is enabled by the first logic state of the delay clock signal, for performing an OR operation on the first and the second comparison signals to provide the duty reference signal.

19. A clock generating circuit for generating an internal clock signal synchronizing with a reference clock signal, the clock generating circuit comprising:
   a controller for receiving the internal clock signal and the reference clock signal and generating first and second divided signals, wherein the controller comprises a multiplexer for selecting one of a delay clock signal and the internal clock signal according to a predetermined toggle control signal, the delay clock signal being obtained by delaying the reference clock signal by a predetermined delay time, wherein the first divided signal is obtained by dividing the selected signal of the delay clock signal and the internal clock signal by 2N, and the second divided signal is obtained by dividing the reference clock signal by 2N;
   a linear current pump for generating first and second pumping signals in response to the first and the second divided signals, wherein each of the first and the second pumping signals has a level-up time rate and a level-down time rate which are the same; and
   a fast comparator for providing a pre-clock signal for generating the internal clock signal, in response to the first and the second pumping signals, wherein the pre-clock signal is activated when the voltage level of at least one of the first and the second pumping signals is lower than a reference voltage.

20. The clock generating circuit of claim 17, wherein, at a first stage of an operation, the multiplexer selects the delay clock signal to generate the first divided signal, wherein, at a second stage of an operation following predetermined clock cycles from the beginning of the first stage of operation, the multiplexer selects the internal clock signal to generate the first divided signal.

* * * * *